United States Patent
Jin

(10) Patent No.: US 7,521,781 B2
(45) Date of Patent: Apr. 21, 2009

(54) INTEGRATED CIRCUIT PACKAGE SYSTEM WITH MOLD CLAMP LINE CRITICAL AREA HAVING WIDENED CONDUCTIVE TRACES

(75) Inventor: Hyeong Gug Jin, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 11/278,343

(22) Filed: Mar. 31, 2006

(65) Prior Publication Data

US 2007/0108589 A1    May 17, 2007

Related U.S. Application Data

(60) Provisional application No. 60/594,629, filed on Apr. 25, 2005.

(51) Int. Cl.
H01L 23/12 (2006.01)
H01L 23/02 (2006.01)
H05K 7/06 (2006.01)
H05K 3/02 (2006.01)

(52) U.S. Cl. ......... 257/678; 257/E23.06; 257/E25.013; 257/E21.505; 257/700; 257/784; 257/701; 257/786; 257/698; 257/691; 257/774; 257/773; 257/696; 257/666; 257/686; 257/723; 257/777

(58) Field of Classification Search ............... 257/678, 257/E21.505, E23.06, E25.013, 700, 784, 257/701, 786, 698, 691, 774, 773, 696, 666, 257/686, 685, 734, 737, 738, 778
See application file for complete search history.

(56) References Cited

U.S. PATENT DOCUMENTS

| 6,175,152 B1 * | 1/2001 | Toyoda | 257/690 |
| 6,710,265 B2 * | 3/2004 | Owens | 174/260 |
| 6,712,529 B2 * | 3/2004 | Horio | 385/92 |
| 6,900,533 B2 * | 5/2005 | Burton | 257/698 |
| 7,084,511 B2 * | 8/2006 | Matsuda | 257/775 |
| 7,102,222 B2 * | 9/2006 | Kuo et al. | 257/690 |
| 2005/0073038 A1 * | 4/2005 | Kuo et al. | 257/690 |
| 2005/0103523 A1 * | 5/2005 | Burton | 174/261 |
| 2005/0110164 A1 * | 5/2005 | Pendse | 257/778 |
| 2006/0228832 A1 * | 10/2006 | Koh | 438/123 |
| 2006/0231936 A1 * | 10/2006 | Matsuda | 257/678 |

FOREIGN PATENT DOCUMENTS

JP    9-162357    *  6/1997

* cited by examiner

Primary Examiner—Alexander O Williams
(74) Attorney, Agent, or Firm—Mikio Ishimaru

(57) ABSTRACT

An integrated circuit package system includes providing a substrate having a first plurality of conductive traces having a first width. An integrated circuit die is attached to the substrate. A mold clamp line is identified on the substrate. A critical area around the mold clamp line is determined. A plurality of widened conductive traces having a second width in the critical area is provided. An encapsulant encapsulates the integrated circuit die.

20 Claims, 2 Drawing Sheets

INTEGRATED CIRCUIT PACKAGE SYSTEM WITH MOLD CLAMP LINE CRITICAL AREA HAVING WIDENED CONDUCTIVE TRACES

CROSS-REFERENCE TO RELATED APPLICATION(S)

This application claims the benefit of U.S. Provisional Patent Application Ser. No. 60/594,629 filed Apr. 25, 2005.

TECHNICAL FIELD

The present invention relates generally to integrated circuit packaging, and more particularly to an integrated circuit package system having conductive traces on a substrate.

BACKGROUND ART

In the electronics industry, the tendency has been to reduce the size of electronic devices such as camcorders and portable telephones while increasing performance and speed. Integrated circuit packages for complex systems typically are comprised of a multiplicity of interconnected integrated circuit dies, or chips. The integrated circuit dies usually are made from a semiconductor material such as silicon or gallium arsenide. Semiconductor devices are formed in the various layers of the integrated circuit chips using photolithographic techniques. The integrated circuit chips may be mounted in packages that are then mounted on printed wiring boards.

Recently, there has been rapid development in semiconductor technology and, as a result, semiconductors are becoming smaller, circuitry within semiconductors is becoming increasingly dense to provide higher speeds.

Packages including integrated circuit chips typically have numerous external pins that are mechanically attached by solder or a variety of other known techniques to conductor patterns on the printed wiring board.

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip.

Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

Tape automated bonding (TAB) involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria.

Unpredictable chip loss has prevented the wide spread adoption of this "chip first" approach in volume production. Furthermore, if the process is not performed on wafers, the commercially available silicon wafer processing equipment may not be compatible with common tooling and handling techniques.

Chip scale packages (CSP) have emerged as a popular packaging technique for memory chips such as static random access memory (SRAM), dynamic random access memory (DRAM) and flash memory as well as other chips with low pin counts. Chip scale packages are hardly larger than the chip itself. However, advanced logic chips such as microprocessors, digital signal processors (DSP) and application-specific integrated circuits (ASIC) often require the package to be considerably larger than the chip to accommodate high pin counts and meet motherboard pitch limitations.

During integrated circuit package assembly, test, and board mount, the package is subject to many different kinds of thermal and mechanical shock, which eventually lead to open-circuits.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a substrate having a first plurality of conductive traces having a first width. An integrated circuit die is attached to the substrate. A mold clamp line is identified on the substrate. A critical area around the mold clamp line is determined. A plurality of widened conductive traces having a second width in the critical area is provided. An encapsulant encapsulates the integrated circuit die.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
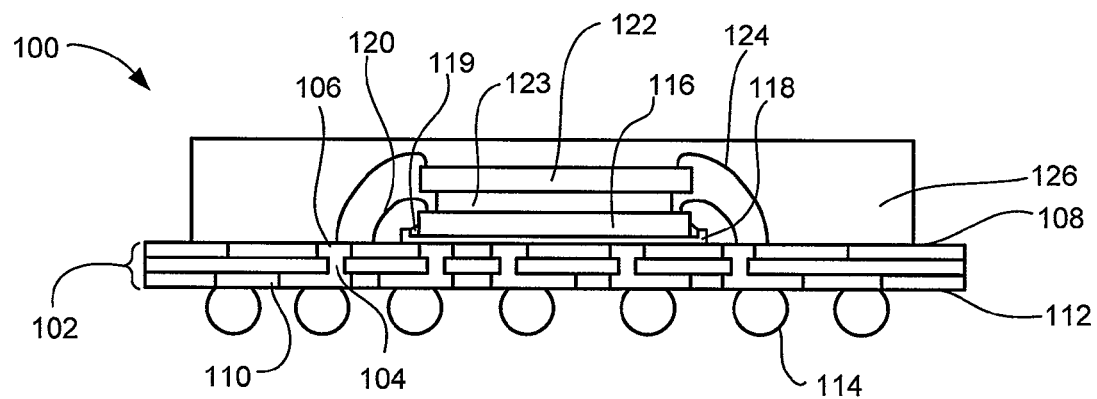
FIG. 1 is a cross-sectional view of an integrated circuit package system in accordance with an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing the embodiments of the system are semi-diagrammatic and not to scale and, particularly, some of the dimensions are for the clarity of presentation and are shown greatly exaggerated in the FIGs. Also, where multiple embodiments are disclosed and described having some features in common, for clarity and ease of illustration and description thereof, like features one to another will ordinarily be described with like reference numerals. The term "horizontal" as used herein is defined as a plane parallel to the conventional plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in accordance with an embodiment of the present invention. The integrated circuit package system 100 includes a substrate 102 having a number of vias 104 through the substrate 102. The vias 104 connect a number of upper contacts 106 formed on the upper surface 108 of the substrate 102 to a number of lower contacts 110 on the lower surface 112 of the substrate 102. A number of solder balls 114 is attached to the lower contacts 108 for connection of the integrated circuit system 100, for example, to a printed circuit board (PCB) (not shown).

A first integrated circuit die 116 is attached to the die attach area 118 located in the central portion of the upper surface 108 of the substrate 102 using a first adhesive layer 119. The first integrated circuit die 116 is wire bonded to the upper contacts 106 using common wire bonding processes, such as ultrasonic bonding, compression bonding, soldering or other suitable techniques. Each of a first number of bonding wires 120 is a fine, conductive wire, such as gold (Au), aluminum (Al), or other conductive wire. The bonding wires 120 are attached between the first integrated circuit die 116.

A second integrated circuit die 122 is attached to the upper surface of the first integrated circuit die 116 using a second adhesive layer 123. The second integrated circuit die 122 is wire bonded to the upper contacts 106 in the upper surface 108 of the substrate 102 using a second number of bonding wires 124 using common wire bonding processes, such as ultrasonic bonding, compression bonding, soldering or other suitable techniques. Although the present invention is shown using the first integrated circuit die 116 and second integrated circuit die 122, it will be understood by those skilled in the art upon a reading of this disclosure that only a first integrated circuit die 116, or more than two integrated circuit dies may be used without departing from the scope of the present invention.

The first integrated circuit die 116, the second integrated circuit die 122, the first bonding wires 120, and the second bonding wires 124 are encapsulated using an encapsulant 126, such as an epoxy molding compound (EMC).

Figure 2:
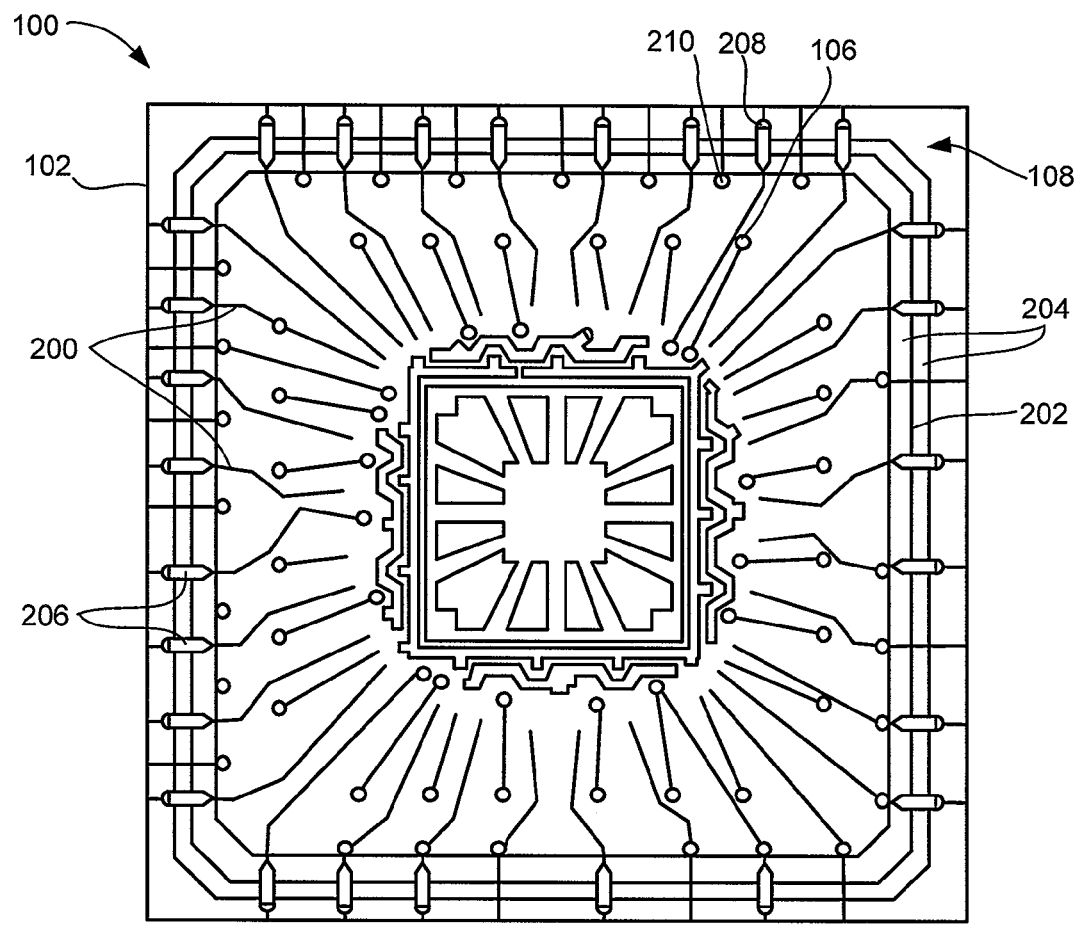
FIG. 2 is a plan view of the structure of FIG. 1 with the encapsulant and integrated circuit dies removed showing a number of electrical traces on the substrate.

Referring now to FIG. 2, therein is shown a plan view of the structure of FIG. 1 with the encapsulant 126, the first integrated circuit die 116, and the second integrated circuit die 122 removed showing a number of conductive traces 200 on the substrate 102. The conductive traces 200 are made of an electrically conductive material, such as copper. The conductive traces 200 on the upper surface of the substrate 102 are thin to allow as many traces as possible on the upper surface of the substrate 102. The typical width of the traces 200 made of copper is between about 50 to about 150 um.

The conductive traces 200 are formed on the upper surface 108 of the substrate 102 in a pattern depending upon the particular design of the integrated circuit package system 100, for example, by using conventional photolithographic processing techniques.

The conductive traces 200 generally emanate from the integrated circuit die attach area 118 toward the outer periphery of the substrate 102. The vias 104 connect the conductive traces 200 to the solder balls 114 as shown in FIG. 1.

A mold clamp line 202 is defined as the position on the upper surface of the substrate 102 where the substrate 102 is clamped during the encapsulating process discussed above with regard to FIG. 1. A critical area 204 is herein defined as the area on the upper surface of the substrate 102 within a predetermined area interior of and exterior of the mold clamp line 202. The size of the critical area 204 varies depending upon the design of the integrated circuit package system 100.

In the embodiment shown in FIG. 2, the critical area 204 is defined as the area between a first number of vias 208 outside the mold clamp line 202 and a second number of vias 210 interior of the mold clamp line 202.

It has been discovered that during integrated circuit package assembly, test, and board mount processes the integrated circuit package system 100 is subjected to many different kinds of thermal and mechanical shocks, which eventually lead to open-circuits in the conductive traces 200. The thermal and mechanical shock damages the conductive traces 200 and causes breakage in the conductive traces 200 resulting in electrical disconnects, or open circuits. These adverse effects are becoming worse as integrated circuit package systems are shrunk in size to add more components to various consumer and business devices resulting in the use of thinner conductive traces 200.

In accordance with an embodiment of the present invention, the conductive traces 200 are widened in the critical area 204 to about three to four times the width of the conductive traces 200 in a non-critical area 205 outside the critical area 204 to provide a number of widened conductive traces 206 in the critical area 204. In the case of conductive traces 200 made of copper, for example, the widened conductive traces 206 in the critical area 204 have a width of about 150 to about 500 um.

Thus, the width of the widened conductive traces 206 in the critical area 204 is about three to four times the normal trace widths of the conductive traces 200.

Figure 3:
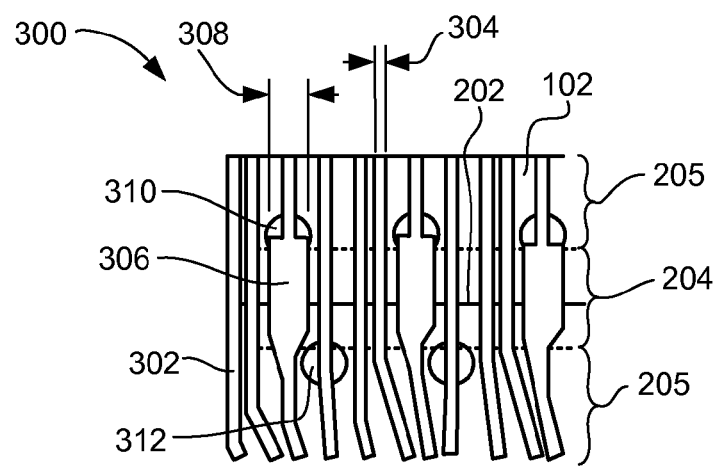
FIG. 3 shows an enlarged view of a portion of the electrical traces shown in FIG. 2.

Referring now to FIG. 3, therein is shown an enlarged view 300 of a portion of the conductive traces 200 in the critical area 204 shown in FIG. 2. A number of conductive traces 302 having a first width 304 is representative of the number of conductive traces 200 shown in FIG. 2. A number of widened conductive traces 306 having a second width 308 is representative of the number of widened conductive traces 206 shown in FIG. 2.

In the embodiment shown in FIG. 3, a first number of vias 310 is representative of the first number of vias 208 shown in FIG. 2 and the second number of vias 312 is representative of the second number of vias 210 shown in FIG. 2. Accordingly, the critical area 204 is located between the first number of vias 310 and the second number of vias 312 on either side of the mold clamp line 202.

It has been discovered that the widened conductive traces 306 are required only where the traces connect with the first number of vias 310. Consequently, in accordance with an embodiment of the present invention, the widened conductive traces 306 are provided on those traces that connect with the first number of vias 310. The traces 302 that do not connect to the first number of vias 310 have the first width 304 through the critical area 204.

It has been discovered that selectively providing widened conductive traces 306 in the critical area 204 around the mold clamp line 202 provides a significant reduction in the amount of trace damage caused by the thermal and mechanical shock the integrated circuit package system 100 is subjected to during assembly, test, and board mount processes.

Figure 4:
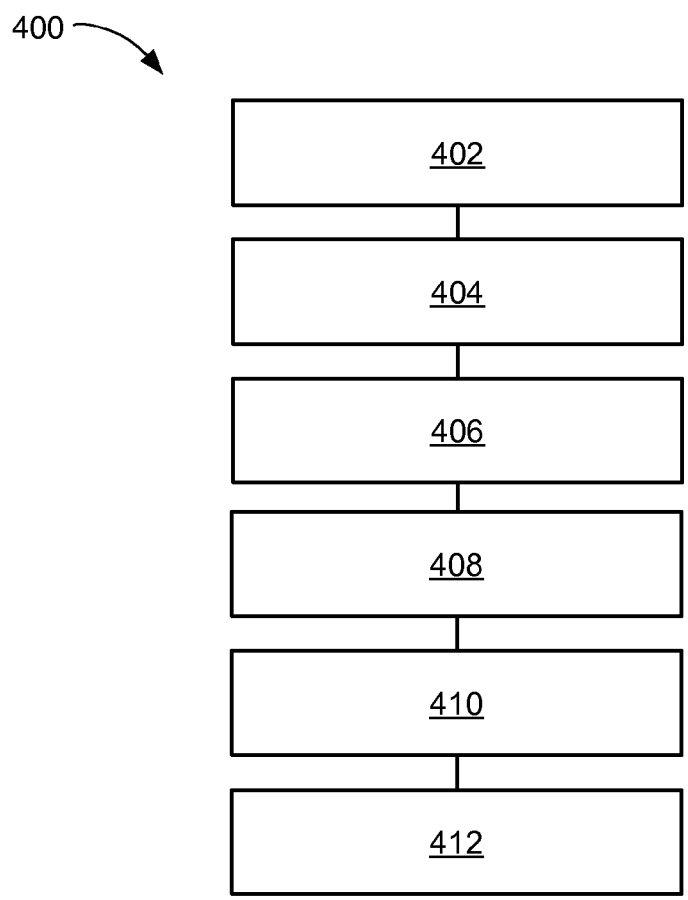
FIG. 4 is a flow chart of an integrated circuit package system in accordance with the present invention.

Referring now to FIG. 4, therein is shown a flow chart of an integrated circuit package system 400, including providing a substrate having a first plurality of conductive traces having a first width in a block 402; attaching an integrated circuit die to the substrate in a block 404; identifying a mold clamp line on the substrate in a block 406; determining a critical area around the mold clamp line in a block 408; providing a plurality of widened conductive traces having a second width in the critical area in a block 410; and encapsulating the integrated circuit die in a block 412.

Thus, it has been discovered that the integrated circuit package system of the present invention furnishes important and heretofore unavailable solutions, capabilities, and functional advantages. The resulting process and configurations are straightforward, economical, uncomplicated, highly versatile and effective, use conventional technologies, and are thus readily suited for manufacturing integrated circuit package systems that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. An integrated circuit package system, comprising:
   providing a substrate having a via and a first plurality of conductive traces having a first width;
   attaching an integrated circuit die to the substrate;
   identifying a mold clamp line on the substrate;
   determining a critical area around the mold clamp line;
   providing a plurality of widened conductive traces having a second width in the critical area on at least a portion of the via; and
   encapsulating the integrated circuit die.

2. The integrated circuit package system as claimed in claim 1, wherein:
   providing the plurality of widened conductive traces provides a plurality of widened conductive traces having a second width that is about three to four times larger than the first width.

3. The integrated circuit package system as claimed in claim 1, wherein:
   providing the first plurality of conductive traces provides a plurality of conductive traces having a width of about 50 to about 150 um; and
   providing the plurality of widened conductive traces provides a plurality of conductive traces having a width of about 150 to about 500 um.

4. The integrated circuit package system as claimed in claim 1, wherein:
   providing the first plurality of conductive traces and providing the plurality of widened conductive traces provides copper conductive traces.

5. The integrated circuit package system as claimed in claim 1, wherein:
   determining the critical area around the mold clamp line defines an area between a first plurality of vias outside the mold clamp line and a second plurality of vias interior of the mold clamp line.

6. An integrated circuit package system, comprising:
   providing a substrate having vias and a die attach area;
   attaching an integrated circuit die to the die attach area;
   providing a first plurality of conductive traces having a first width on the substrate outside the die attach area;
   identifying a mold clamp line on the substrate;
   determining a critical area around the mold clamp having a first number of the vias outside the mold clamp line and a second number of the vias inside the mold clamp line;
   providing a plurality of widened conductive traces having a second width only on the first number of vias in the critical area;
   connecting the integrated circuit die to the first plurality of conductive traces and the plurality of widened conductive traces; and
   encapsulating the integrated circuit die.

7. The integrated circuit package system as claimed in claim 6, wherein:
   providing the plurality of widened conductive traces provides a plurality of widened conductive traces having a second width that is about three to four times larger than the first width.

8. The integrated circuit package system as claimed in claim 6, wherein:
   providing the first plurality of conductive traces provides a plurality of conductive traces having a width of about 50 to about 150 um; and
   providing the plurality of widened conductive traces provides a plurality of conductive traces having a width of about 150 to about 500 um.

9. The integrated circuit package system as claimed in claim 6, wherein:
   providing the first plurality of conductive traces and providing the plurality of widened conductive traces provides copper conductive traces.

10. The integrated circuit package system as claimed in claim 6, wherein:
    determining the critical area around the mold clamp line defines an area between a first plurality of vias outside the mold clamp line and a second plurality of vias interior of the mold clamp line.

11. An integrated circuit package system, comprising:
    a substrate having via and a first plurality of conductive traces having a first width;
    an integrated circuit die attached to the substrate;
    a mold clamp line on the substrate;
    critical area around the mold clamp line;
    a plurality of widened conductive traces having a second width in the critical area over at least a portion of the via; and
    an encapsulant encapsulating the integrated circuit die.

12. The integrated circuit package system as claimed in claim 11, wherein:
    the plurality of widened conductive traces comprises a plurality of widened conductive traces having a second width that is about three to four times larger than the first width.

13. The integrated circuit package system as claimed in claim 11, wherein:
    the first plurality of conductive traces comprises a plurality of conductive traces having a width of about 50 to about 150 um; and
    the plurality of widened conductive traces comprises a plurality of conductive traces having a width of about 150 to about 500 um.

14. The integrated circuit package system as claimed in claim 11, wherein:
    the first plurality of conductive traces and the plurality of widened conductive traces comprise copper conductive traces.

15. The integrated circuit package system as claimed in claim 11, wherein:
    the critical area around the mold clamp line defines an area between a first plurality of vias outside the mold clamp line and a second plurality of vias interior of the mold clamp line.

16. The integrated circuit package system as claimed in claim 11, wherein:
    the substrate having vias outside the mold clamp line and inside the mold claim line, and a die attach area;
    the integrated circuit die is attached to the die attach area;
    the integrated circuit die is connected to the first plurality of conductive traces and the plurality of widened conductive traces, the widened conductive traces only connected on the vias outside the mold clamp line.

17. The integrated circuit package system as claimed in claim 16, wherein:
    the plurality of widened conductive traces comprises a plurality of widened conductive traces having a second width that is about three to four times larger than the first width.

18. The integrated circuit package system as claimed in claim 16, wherein:
    the first plurality of conductive traces comprises a plurality of conductive traces having a width of about 50 to about 150 um; and
    the plurality of widened conductive traces comprises a plurality of conductive traces having a width of about 150 to about 500 um.

19. The integrated circuit package system as claimed in claim 16, wherein:
    the first plurality of conductive traces and the plurality of widened conductive traces comprises copper conductive traces.

20. The integrated circuit package system as claimed in claim 16, wherein:
    the critical area around the mold clamp line defines an area between a first plurality of vias outside the mold clamp line and a second plurality of vias interior of the mold clamp line.

* * * * *